(12) United States Patent
Nishimura et al.

(10) Patent No.: US 8,208,231 B2
(45) Date of Patent: Jun. 26, 2012

(54) TUNNELING MAGNETIC SENSING ELEMENT WITH INSERTION MAGNETIC LAYER INSPIRED INTO SOFT MAGNETIC LAYER

(75) Inventors: Kazumasa Nishimura, Niigata-ken (JP); Hidekazu Kobayashi, Niigata-ken (JP); Masamichi Saito, Niigata-ken (JP); Yosuke Ide, Niigata-ken (JP); Ryo Nakabayashi, Niigata-ken (JP); Yoshihiro Nishiyama, Niigata-ken (JP); Akio Hanada, Niigata-ken (JP); Naoya Hasegawa, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 329 days.

(21) Appl. No.: 12/617,199

(22) Filed: Nov. 12, 2009

(65) Prior Publication Data
US 2010/0055501 A1    Mar. 4, 2010

Related U.S. Application Data

(63) Continuation of application No. PCT/JP2008/058907, filed on May 15, 2008.

(30) Foreign Application Priority Data

May 22, 2007 (JP) ................................. 2007-134975

(51) Int. Cl.
*G11B 5/33* (2006.01)
(52) U.S. Cl. ................................... 360/324.2
(58) Field of Classification Search ......................... None
See application file for complete search history.

(56) References Cited

U.S. PATENT DOCUMENTS

| 6,381,107 | B1 | 4/2002 | Redon et al. |
| 7,218,483 | B2 | 5/2007 | Yuasa et al. |
| 7,446,983 | B2 * | 11/2008 | Miyauchi et al. ........ 360/324.11 |
| 2002/0048128 | A1 | 4/2002 | Kamiguchi et al. |

(Continued)

FOREIGN PATENT DOCUMENTS

JP    2001-006130 A    1/2001
(Continued)

OTHER PUBLICATIONS

Office Action issued in corresponding Japanese Patent Application No. 2009-515182, mailed Oct. 11, 2011.

(Continued)

*Primary Examiner* — David D Davis
(74) *Attorney, Agent, or Firm* — Brinks Hofer Gilson & Lione (57) ABSTRACT

A tunneling magnetic sensing element includes a laminate in which a pinned magnetic layer having a magnetization direction pinned, an insulating barrier layer, and a free magnetic layer having a magnetization direction variable with an external magnetic field are laminated in order from below. The insulating barrier layer is made of Mg—O. The free magnetic layer has a soft magnetic layer and an enhanced layer disposed between the soft magnetic layer and the insulating barrier layer to have a spin polarization ratio higher than the soft magnetic layer. An insertion magnetic layer made of one selected from Co—Fe—B, Co—B, Fe—B, and Co—Fe is inserted into the soft magnetic layer in a direction parallel to the interface of each layer constituting the laminate, and the soft magnetic layer is divided into multiple layers in a thickness direction through the insertion magnetic layer.

7 Claims, 6 Drawing Sheets

U.S. PATENT DOCUMENTS

| | | |
|---|---|---|
| 2003/0011944 A1 | 1/2003 | Hosomi |
| 2003/0011945 A1 | 1/2003 | Yuasa et al. |
| 2008/0226948 A1 * | 9/2008 | Mizuno et al. ............. 428/811.2 |

FOREIGN PATENT DOCUMENTS

| | | |
|---|---|---|
| JP | 2002-359412 A | 12/2002 |
| JP | 2003-008102 A | 1/2003 |
| JP | 2006/344728 | 12/2006 |
| JP | 2007/059879 | 3/2007 |

OTHER PUBLICATIONS

Office Action issued in corresponding Japanese Patent Application No. 2009-515182, mailed Jul. 26, 2011.

* cited by examiner

▲ CoB30 IS INSERTED INTO NiFe: EXAMPLE 1
△ FeB30 IS INSERTED INTO NiFe: EXAMPLE 1
◆ NONE IS INSERTED INTO NiFe: RELATED ART EXAMPLE 1

TUNNELING MAGNETIC SENSING ELEMENT WITH INSERTION MAGNETIC LAYER INSPIRED INTO SOFT MAGNETIC LAYER

CROSS REFERENCE TO RELATED APPLICATIONS

The present invention contains subject matter related to Japanese Patent Application No. 2007-134975 filed in the Japanese Patent Office on May 22, 2007, the entire contents of which being incorporated herein by reference.

BACKGROUND

1. Technical Field

The present invention relates to a tunneling magnetic sensing element capable of increasing a rate of change in resistance ($\Box$R/R) and reducing a coercive force HC of a free magnetic layer.

2. Related Art

A tunneling magnetic sensing element (TMR element) is a device having resistance changed by a tunneling effect. When the magnetization direction of a pinned magnetic layer is antiparallel to the magnetization direction of a free magnetic layer, a tunneling current does not easily flow through an insulating barrier layer provided between the pinned magnetic layer and the free magnetic layer, thereby maximizing the resistance. In contrast, when the magnetization direction of the pinned magnetic layer is parallel to the magnetization direction of the free magnetic layer, the tunneling current easily flows, and thus the resistance is maximized.

As the magnetization direction of the free magnetic layer changes by the effect of an external magnetic field on the basis of this principle, the changes in electrical resistance are detected as changes in voltage so as to detect a leakage magnetic field from a recording medium.

Japanese Unexamined Patent Application Publication Nos. 2006-344728 and 2007-59879 are examples of the related art.

SUMMARY

It has been known that, when the insulating barrier layer of the tunneling magnetic sensing element is made of Mg—O (magnesium oxide), a higher rate of change in resistance ($\Delta$R/R) can be achieved, as compared with a case where the insulating barrier layer is made of Al—O or Ti—O.

However, in order to cope with high density recording, a further increase in the rate of change in resistance ($\Delta$R/R) is needed.

In addition to an increase in the rate of change in resistance ($\Delta$R/R), with regard to the free magnetic layer, it is necessary to satisfactorily maintain the soft magnetic properties represented by a coercive force Hc and to improve magnetic sensitivity, thereby stabilizing the reproduction characteristics.

Patent Documents described above are not intended to increase the rate of change in resistance ($\Delta$R/R) and to reduce the coercive force Hc of the free magnetic layer. Of course, there is no disclosure of the configuration of the free magnetic layer for solving such problems inherent in the related art.

It is desirable to provide a tunneling magnetic sensing element capable of increasing the rate of change in resistance ($\Delta$R/R) and reducing the coercive force Hc of the free magnetic layer with the improvement in the configuration of the free magnetic layer.

A tunneling magnetic sensing element according to an embodiment of the invention includes a laminate in which a pinned magnetic layer having a magnetization direction pinned, an insulating barrier layer, and a free magnetic layer having a magnetization direction variable with an external magnetic field, or the free magnetic layer, the insulating barrier layer, and the pinned magnetic layer are laminated in order from below. The insulating barrier layer is made of Mg—O. The free magnetic layer has a soft magnetic layer and an enhanced layer disposed between the soft magnetic layer and the insulating barrier layer to have a spin polarization ratio higher than the soft magnetic layer. An insertion magnetic layer made of one selected from Co—Fe—B, Co—B, Fe—B, and Co—Fe is inserted into the soft magnetic layer in a direction parallel to the interface of each layer constituting the laminate, and the soft magnetic layer is divided into multiple layers in a thickness direction through the insertion magnetic layer.

With this configuration, in the tunneling magnetic sensing element including the insulating barrier layer made of Mg—O, it is possible to increase the rate of change in resistance ($\Delta$R/R) effectively and also to reduce the coercive force Hc of the free magnetic layer, as compared with the related art.

The insertion magnetic layer may be made of a magnetic material represented by a composition formula {CoXFe100−X}100−YBY (where the atomic ratio X is equal to or larger than 0 and equal to or smaller than 100, and the composition ratio Y is equal to or larger than 0 at % and equal to or smaller than 30 at %). With this configuration, it is possible to obtain a high rate of change in resistance ($\Delta$R/R).

The insertion magnetic layer may be made of Fe—B or Co—Fe—B. In this case, the atomic ratio X is equal to or larger than 0 and equal to or smaller than 50, and the composition ratio Y is equal to or larger than 10 at % and equal to or smaller than 30 at %. With this configuration, it is possible to increase the rate of change in resistance ($\Box$R/R) more effectively.

The average thickness of the insertion magnetic layer may be equal to or larger than 2 Å and equal to or smaller than 10 Å. With this configuration, it is possible to effectively increase the rate of change in resistance ($\Delta$R/R).

The soft magnetic layer may be made of Ni—Fe, and the enhance layer may be made of Co—Fe. With this configuration, it is possible to satisfactorily maintain the soft magnetic properties of the free magnetic layer and also to effectively increase the rate of change in resistance ($\Delta$R/R).

The pinned magnetic layer, the insulating barrier layer, and the free magnetic layer may be laminated in order from below. With this configuration, it is advantageous to effectively obtain a high rate of change in resistance ($\Delta$R/R).

According to the embodiment of the invention, in a tunneling magnetic sensing element including an insulating barrier layer made of Mg—O, it is possible to effectively increase the rate of change in resistance ($\Delta$R/R) and also to reduce the coercive force Hc of the free magnetic layer, as compared with the related art.

DESCRIPTION EXEMPLARY EMBODIMENTS

Figure 1:
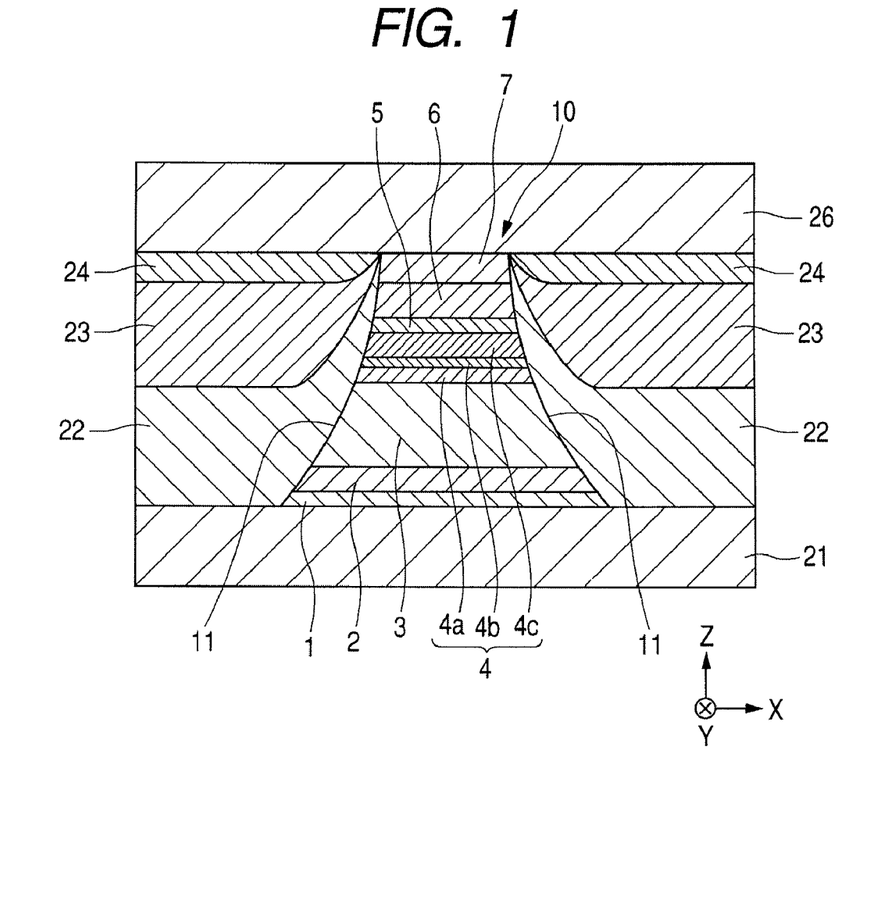
FIG. 1 is a sectional view of a tunneling magnetic sensing element taken in a direction parallel to a surface facing a recording medium.
Figure 2:
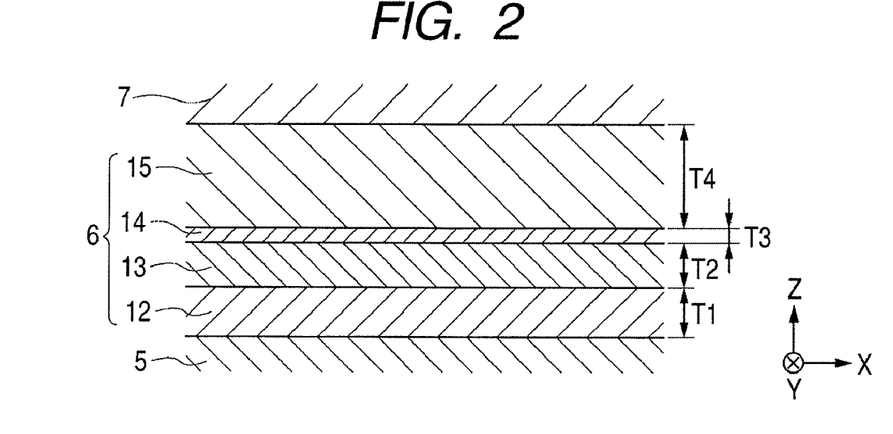
FIG. 2 is a partial enlarged sectional view showing the structure of a tunneling magnetic sensing element of a first embodiment taken in the same direction as in FIG. 1.

FIG. 1 is a sectional view of a tunneling magnetic sensing element of this embodiment taken in a direction parallel to a surface facing a recording medium. FIG. 2 is a partial enlarged sectional view mainly showing a free magnetic layer of the tunneling magnetic sensing element shown in FIG. 1 on a magnified scale. Although FIG. 1 shows the free magnetic layer having a single-layered structure, actually, the free magnetic layer may have a laminated structure shown in FIG. 2.

The tunneling magnetic sensing element is to be installed at a trailing side end of a floating slider of a hard disk device to detect a leakage magnetic field (recording magnetic field) from a magnetic recording medium. In FIG. 1, the X direction is the track width direction, the Y direction is the direction of the leakage magnetic field from the magnetic recording medium (height direction), and the Z direction is the direction of movement of the magnetic recording medium and the direction in which layers of the tunneling magnetic sensing element are laminated.

Referring to FIG. 1, a lower shield layer 21 made of, for example, Ni—Fe is formed at the bottom. A laminate 10 is formed on the lower shield layer 21. The tunneling magnetic sensing element has the laminate 10, and an insulating layer 22, a hard bias layer 23, and a protective layer 24, all of which are formed on both sides of the laminate 10 in the track width direction (the X direction in the drawing).

A base layer of the laminate 10 is an underlayer 1 made of at least one nonmagnetic element selected from Ta, Hf, Nb, Zr, Ti, Mo, and W. A seed layer 2 is provided on the underlayer 1. The seed layer 2 is made of one selected from Ni—Fe—Cr, Cr, and Ru. The underlayer 1 may not be formed.

An antiferromagnetic layer 3 formed on the seed layer 2 is preferably made of an antiferromagnetic material containing an element $\alpha$ (where the element $\alpha$ is at least one element selected from Pt, Pd, Ir, Rh, Ru, and Os) and Mn.

The antiferromagnetic layer 3 may be made of an antiferromagnetic material containing the element $\alpha$, an element $\alpha'$ (where the element $\alpha'$ is at least one element selected from Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare earth elements), and Mn.

The antiferromagnetic layer 3 is made of, for example, Ir—Mn.

A pinned magnetic layer 4 is formed on the antiferromagnetic layer 3. The pinned magnetic layer 4 has a laminated ferrimagnetic structure in which a first pinned magnetic layer 4a, a nonmagnetic intermediate layer 4b, and a second pinned magnetic layer 4c are laminated in order from below. The magnetization direction of the first pinned magnetic layer 4a and the magnetization direction of the second pinned magnetic layer 4c are made antiparallel to each other by an exchange coupling magnetic field (Hex) at the interface between the pinned magnetic layer 4 and the antiferromagnetic layer 3 and an antiferromagnetic exchange coupling magnetic field (Ruderman-Kittel-Kasuya-Yosida interaction, that is, RKKY interaction) through the nonmagnetic intermediate layer 4b. With the pinned magnetic layer 4 having a laminated ferrimagnetic structure, the magnetization direction of the pinned magnetic layer 4 can be stabilized, and the exchange coupling magnetic field generated at the interface between the pinned magnetic layer 4 and the antiferromagnetic layer 3 can be apparently increased. The first pinned magnetic layer 4a and the second pinned magnetic layer 4c are formed so as to have a thickness of about 10 to 40 Å, and the nonmagnetic intermediate layer 4b is formed so as to have a thickness of about 8 Å to 100 Å.

The first pinned magnetic layer 4a is made of a ferromagnetic material, such as Co—Fe, Ni—Fe, Co—Fe—Ni, or the like. The second pinned magnetic layer 4c may be made of the same material as the first pinned magnetic layer 4a. Preferable examples of the material for the second pinned magnetic layer 4c will be described below. The nonmagnetic intermediate layer 4b is made of a nonmagnetic conductive material, such as Ru, Rh, Ir, Cr, Re, Cu, or the like.

An insulating barrier layer 5 made of Mg—O (magnesium oxide) is formed on the pinned magnetic layer 4. The composition ratio of Mg in the Mg—O alloy is preferably in a range of 40 to 60 at %. Most preferably, Mg50 at % O50 at % is used.

A free magnetic layer 6 is formed on the insulating barrier layer 5. The configuration of the free magnetic layer 6 will be described below.

The width dimension of the free magnetic layer 6 in the track width direction (the X direction in the drawing) determines the track width Tw.

A protective layer 7 made of Ta or the like is formed on the free magnetic layer 6.

End surfaces 11 and 11 of the laminate 10 on both sides in the track width direction (the X direction in the drawing) form inclined surfaces so that the width dimension in the track width direction gradually tapers upward.

As shown in FIG. 1, an insulating layer 22 is formed so as to cover the lower shield layer 21 and the end surfaces 11 of the laminate 10, which extend to both sides of the laminate 10. A hard bias layer 23 is formed on the insulating layer 22, and a protective layer 24 is formed on the hard bias layer 23. The protective layer 24 is made of a nonmagnetic material, such as Ta or the like.

A bias underlayer (not shown) may be formed between the insulating layer 22 and the hard bias layer 23. The bias underlayer is made of Cr, W, Ti, or the like.

The insulating layer 22 is made of an insulating material, such as Al2O3 or SiO2. The insulating layer 22 insulates the upper part and the lower part of the hard bias layer 23 in order to prevent a current flowing in the laminate 10 in a direction perpendicular to the interfaces of the layers from separately flowing to both sides of the laminate 10 in the track width direction. The hard bias layer 23 is made of, for example, Co—Pt or Co—Cr—Pt.

An upper shield layer 26 made of Ni—Fe or the like is formed on the laminate 10 and the protective layer 24.

In the embodiment shown in FIG. 1, the lower shield layer 21 and the upper shield layer 26 function as electrode layers for the laminate 10, and a current flows in a direction perpendicular to the surfaces of the layers of the laminate 10 (a direction parallel to the Z direction in the drawing).

The free magnetic layer 6 is magnetized in a direction parallel to the track width direction (the X direction in FIG. 1) by a bias magnetic field from the hard bias layer 23. On the other hand, the first pinned magnetic layer 4a and the second pinned magnetic layer 4c constituting the pinned magnetic layer 4 are magnetized in a direction parallel to the height direction (the Y direction in FIG. 1). The pinned magnetic layer 4 has a laminated ferrimagnetic structure, so the first pinned magnetic layer 4a and the second pinned magnetic layer 4c are magnetized antiparallel to each other. The magnetization direction of the pinned magnetic layer 4 is pinned (that is, the magnetization direction of the pinned magnetic layer 4 is not changed by an external magnetic field), but the magnetization direction of the free magnetic layer 6 is changed by an external magnetic field.

If the magnetization direction of the free magnetic layer 6 is changed by an external magnetic field, when the magnetization direction of the second pinned magnetic layer 4c and the magnetization direction of the free magnetic layer are made antiparallel to each other, a tunneling current does not easily flow through the insulating barrier layer 5 provided between the second pinned magnetic layer 4c and the free magnetic layer 6, thereby maximizing the resistance. In contrast, when the magnetization direction of the second pinned magnetic layer 4c and the magnetization direction of the free magnetic layer 6 are made parallel to each other, the tunneling current easily flows, thereby minimizing the resistance.

As the magnetization direction of the free magnetic layer 6 changes by the effect of an external magnetic field on the basis of this principle, the changes in electrical resistance are detected as changes in voltage so as to detect a leakage magnetic field from a magnetic recording medium.

Features of the tunneling magnetic sensing element of this embodiment will be described below.

As shown in FIG. 2, the free magnetic layer 6 has an enhanced layer 12, a first soft magnetic layer 13, an insertion magnetic layer 14, and a second soft magnetic layer 15 which are laminated in order from below.

The enhance layer 12 is made of a magnetic material having a spin polarization ratio higher than those of the first soft magnetic layer 13 and the second soft magnetic layer 15. The enhanced layer 12 is preferably made of Co—Fe. It can be seen that, if the enhanced layer 12 is not formed, the rate of change in resistance ($\Delta R/R$) significantly decreases. For this reason, the enhanced layer 12 is a layer which is to be essentially formed. If the Fe concentration in the Co—Fe alloy for forming the enhanced layer 12 increases, it is possible to obtain a high rate of change in resistance ($\Delta R/R$). The Fe concentration in the Co—Fe alloy is preferably in a range of 25 at % to 100 at %.

The first soft magnetic layer 13 and the second soft magnetic layer 15 are made of a material having excellent soft magnetic properties, such as a low coercive force, a low anisotropic magnetic field, and the like, as compared with the enhanced layer 12. The first soft magnetic layer 13 and the second soft magnetic layer 15 may be made of different soft magnetic materials, but both are preferably made of Ni—Fe. The Fe concentration in the Ni—Fe alloy is preferably in a range of 10 at % to 20 at %.

The insertion magnetic layer 14 is made of one selected from Co—Fe—B, Co—Fe, Fe—B, and Co—Fe.

The insertion magnetic layer 14 is inserted between the first soft magnetic layer 13 and the second soft magnetic layer 15 in a direction (X-Y plane direction) parallel to the interface of each layer constituting the laminate 10.

Although in the related art, the free magnetic layer 6 is formed by laminating the enhanced layer 12 and the soft magnetic layer, in this embodiment, the insertion magnetic layer 14 made of Co—Fe—B is inserted into the soft magnetic layer. Thus, the soft magnetic layer is divided into the first soft magnetic layer 13 and the second soft magnetic layer 15 in a thickness direction through the insertion magnetic layer 14, and the soft magnetic layers 13 and 15 have small thickness.

The first soft magnetic layer 13 and the second soft magnetic layer 15 are completely (continuously) divided by the insertion magnetic layer 14, but first soft magnetic layer 13 and the second soft magnetic layer 15 may be intermittently divided. For example, when the insertion magnetic layer 14 is formed so as to have a small thickness and a pin hole is generated in the insertion magnetic layer 14, the first soft magnetic layer 13 and the second soft magnetic layer 15 are in contact with each other in the pin hole. This case still falls within the scope of the invention. Meanwhile, if the first soft magnetic layer 13 and the second soft magnetic layer 15 are completely (continuously) divided by the insertion magnetic layer 14, it is advantageous to increase the rate of change in resistance ($\Delta R/R$).

As in this embodiment, in the tunneling magnetic sensing element including the insulating barrier layer 5 made of Mg—O, the second pinned magnetic layer 4c/insulating barrier layer 5/enhanced layer 12 is formed so as to have a body-centered cubic structure (bcc structure) in which equivalent crystal planes represented by a {100} plane are preferentially aligned in a direction parallel to the interface (the X-Y plane). This is important to improve the rate of change in resistance ($\Delta R/R$).

Meanwhile, the soft magnetic layer made of Ni—Fe formed on the enhanced layer 12 is formed so as to have a face-centered cubic structure (fcc structure) in which equivalent crystal planes represented by a {111} plane are preferentially aligned in a direction parallel to the interface (the X-Y plane). For this reason, as in the related art, when the soft magnetic layer (Ni—Fe) having a thick single-layered structure is provided on the enhanced layer 12, the crystal structure of the enhance layer 12 may be distorted by the effect of the crystal structure of the overlying soft magnetic layer (Ni—Fe).

In contrast, in this embodiment, the insertion magnetic layer 14 made of, for example, Co—Fe—B is interposed between the soft magnetic layers 13 and 15. For this reason, the first soft magnetic layer 13 in contact with the enhanced layer 12 can have a thickness smaller than when no insertion magnetic layer 14 is formed, and the first soft magnetic layer 13 and the second soft magnetic layer 15 are formed as a single body. Thus, the crystal orientation of the first soft magnetic layer 13 itself in contact with the enhanced layer 12 can be weakened. Further, the insertion magnetic layer 14 is in an amorphous state during a non-heat treatment (as deposited). Therefore, the second soft magnetic layer 15 and the first soft magnetic layer 13 are divided at the insertion magnetic layer 14. As a result, the effect of the soft magnetic layer on the crystal structure of the enhanced layer 12 can be weakened.

In this way, in this embodiment, the enhanced layer 12 can be effectively formed on the insulating barrier layer 5 made of Mg—O so as to have a body-centered cubic structure (bcc structure) in which equivalent crystal planes represented by a {100} plane are preferentially aligned in a direction parallel to the interface (the X-Y plane). Therefore, it is possible to increase the rate of change in resistance (ΔR/R), as compared with the related art.

In this embodiment, the total thickness of the average thickness T2 of the first soft magnetic layer 13 and the average thickness T2 of the second soft magnetic layer 15 can be the same as the thickness of the single-layered soft magnetic layer of the related art, so the soft magnetic properties of the free magnetic layer can be satisfactorily maintained. In particular, if the insertion magnetic layer 14 is interposed between the first soft magnetic layer 13 and the second soft magnetic layer 15, as shown in the experiments described below, it is possible to reduce the coercive force Hc of the free magnetic layer 6, as compared with the related art.

In this embodiment, the insertion magnetic layer 14 is preferably made of a magnetic material represented by a composition formula {CoXFe100-X}100-YBY (where the atomic ratio X is equal to or larger than 0 and equal to or smaller than 100, and the composition ratio Y is equal to or larger than 0 at % and equal to or smaller than 30 at %). As shown in the experiments described below, with the insertion magnetic layer 14 made of the magnetic material represented by the above-described composition formula, it is possible to increase the rate of change in resistance (ΔR/R), as compared with the related art.

The insertion magnetic layer is preferably made of Fe—B or Co—Fe—B. In this case, in the above-described composition formula, the atomic ratio X is equal to or larger than 0 and equal to or smaller than 50, and the composition ratio Y is equal to or larger than 10 at % and equal to or smaller than 30 at %. Therefore, it is possible to increase the rate of change in resistance (ΔR/R) more effectively.

In this embodiment, the average thickness T3 of the insertion magnetic layer 14 is preferably equal to or larger than 2 Å and equal to or smaller than 10 Å. More preferably, the average thickness T3 is equal to or larger than 6 Å and equal to or smaller than 10 Å, and most preferably, the average thickness T3 is equal to or larger than 8 Å and equal to or smaller than 10 Å. Therefore, it is possible to effectively increase the rate of change in resistance (□R/R).

The insertion magnetic layer 14 is magnetic, so even if the average thickness T3 of the insertion magnetic layer 14 is large, the first soft magnetic layer 13, the insertion magnetic layer 14, and the second soft magnetic layer 15 are magnetically coupled to each other. For example, if a nonmagnetic layer is inserted between the first soft magnetic layer 13 and the second soft magnetic layer 15, when the thickness of the nonmagnetic layer is equal to or larger than 5 Å, magnetic coupling between the first soft magnetic layer 13 and the second soft magnetic layer 15 is likely to be broken, and the stability of the reproduction characteristics may be deteriorated. For this reason, it is considered that it is necessary to form the nonmagnetic layer so as to have a very small thickness. In contrast, in this embodiment, the average thickness T3 of the insertion magnetic layer 14 can be made equal to or larger than 6 Å or equal to or larger than 8 Å, without taking breakage of magnetic coupling into consideration. As shown in the experiments described below, if the average thickness T3 of the insertion magnetic layer 14 is small, it is expected that the rate of change in resistance (ΔR/R) increases. Therefore, in this embodiment, the average thickness T3 of the insertion magnetic layer 14 can be defined without taking breakage of magnetic coupling into consideration.

However, if the average thickness T3 of the insertion magnetic layer 14 is too large, the thickness of the entire free magnetic layer 6 may become small, and the gap length (GL) between the upper and lower shield layers may be increased. For this reason, in this embodiment, the upper limit of the average thickness T3 of the insertion magnetic layer 14 is set to 10 Å. The experiments described below show that, even if the average thickness T3 of the insertion magnetic layer 14 is large as 10 Å, a high rate of change in resistance (□R/R) is obtained.

As shown in FIG. 2, the average thickness of the enhanced layer 12 is T1, the average thickness of the first soft magnetic layer 13 is T2, and the average thickness of the second soft magnetic layer 15 is T4.

If the average thickness T1 of the enhanced layer 12 is equal to or larger than 2 Å and equal to or smaller than 30 Å, it is advantageous to effectively increase the rate of change in resistance (□R/R). More preferably, the average thickness T1 of the enhanced layer 12 is equal to or larger than 10 Å and equal to or smaller than 20 Å.

The average thickness T2 of the first soft magnetic layer 13 is preferably equal to or larger than 5 Å and equal to or smaller than 30 Å. If the average thickness T2 of the first soft magnetic layer 13 is too large, the effects of the insertion magnetic layer 14 inserted between the first soft magnetic layer 13 and the second soft magnetic layer 15 are impaired. That is, an effect of weakening the crystal orientation of the first soft magnetic layer 13 itself by making the average thickness T2 of the first soft magnetic layer 13 small in contact with the enhanced layer 12, and an effect of increasing the rate of change in resistance (□R/R) by dividing the crystal orientation between the first soft magnetic layer 13 and the second soft magnetic layer 15 so as to preferentially align the {100} plane of the enhance layer 12 are impaired. If the average thickness T2 of the first soft magnetic layer 13 is too small, an effect of reducing the coercive force Hc of the free magnetic layer 6 is impaired. For this reason, in this embodiment, the average thickness T2 of the first soft magnetic layer 13 is set to be equal to or larger than 5 Å and equal to or smaller than 30 Å.

The total thickness of the average thickness T4 of the second soft magnetic layer 15 and the average thickness T2 of the first soft magnetic layer 13 is adjusted so as to be equal to or larger than 40 Å and equal to or smaller than 70 Å. Thus, the soft magnetic properties such as the coercive force Hc of the free magnetic layer 6 and the like can be satisfactorily maintained.

Although in FIG. 1 and FIG. 2, the antiferromagnetic layer 3, the pinned magnetic layer 4, the insulating barrier layer 5, the free magnetic layer 6, and the protective layer 7 are laminated in order from below, the free magnetic layer 6, the insulating barrier layer 5, the pinned magnetic layer 4, the antiferromagnetic layer 3, and the protective layer 7 may be laminated in order from below.

Figure 3:
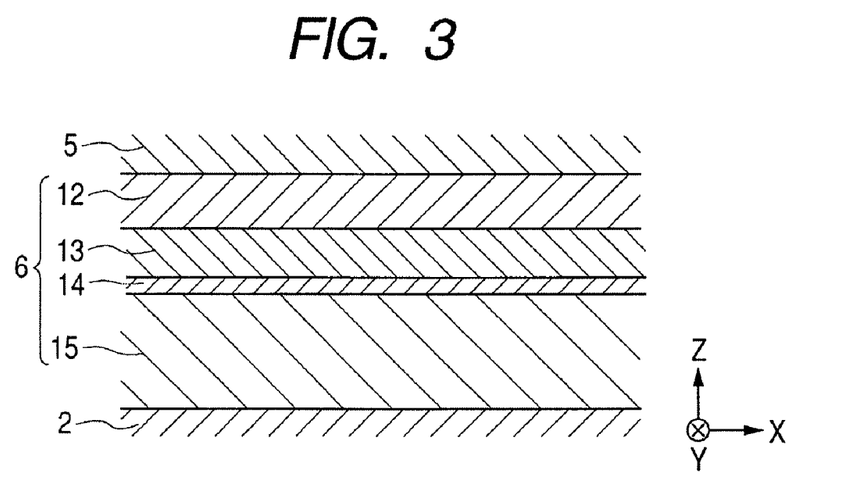
FIG. 3 is a partial enlarged sectional view showing the structure of a tunneling magnetic sensing element of a second embodiment taken in the same direction as in FIG. 1.

In such a case, as shown in FIG. 3, the free magnetic layer 6 is formed by laminating the second soft magnetic layer 15, the insertion magnetic layer 14, the first soft magnetic layer 13, and the enhanced layer 12 in order from below, and the insulating barrier layer 5 is formed on the free magnetic layer 6. The thickness or material of each layer constituting the free magnetic layer 6 is as described above.

Alternatively, a dual-type tunneling magnetic sensing element may be used in which a lower antiferromagnetic layer, a lower pinned magnetic layer, a lower insulating barrier layer, a free magnetic layer, an upper insulating barrier layer, an upper pinned magnetic layer, and an upper antiferromagnetic layer are laminated in order from below.

Figure 4:
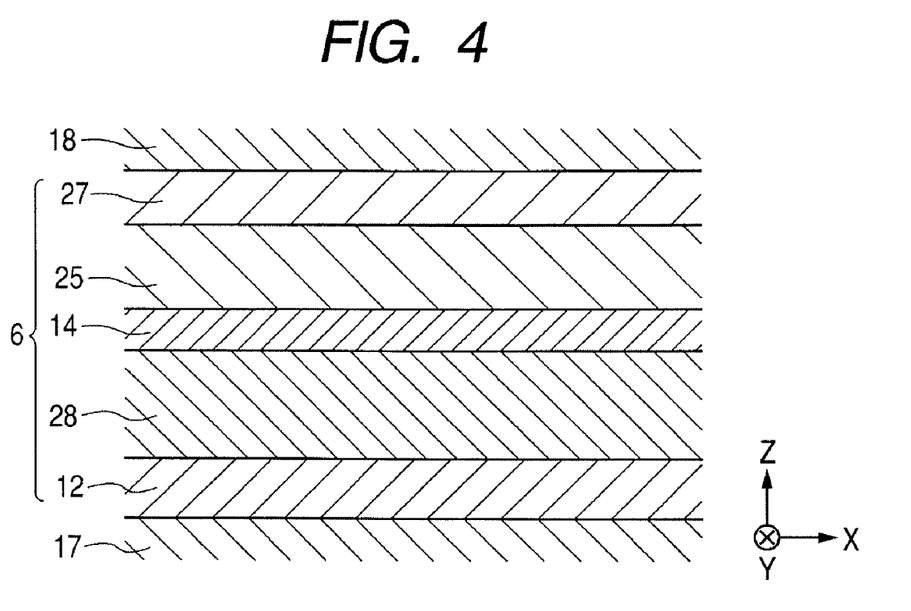
FIG. 4 is a partial enlarged sectional view showing the structure of a tunneling magnetic sensing element of a third embodiment taken in the same direction as in FIG. 1.

In such a case, as shown in FIG. 4, the free magnetic layer 6 is formed by laminating an enhanced layer 12, a soft magnetic layer 28, an insertion magnetic layer 14, a soft magnetic layer 25, and an enhanced layer 27 in order from below. A lower insulating barrier layer 17 is formed below the enhance layer 12 at the lower part of the free magnetic layer 6, and an upper insulating barrier layer 18 is formed on the upper enhanced layer 27 at the upper part of the free magnetic layer 6. The thickness or material of each layer constituting the free magnetic layer 6 is as described above. The soft magnetic layers 25 and 28 are formed so as to have the same thickness as that of the first soft magnetic layer 13 shown in FIG. 2.

In the embodiments shown in FIGS. 2 to 4, one insertion magnetic layer 14 inserted into the soft magnetic layer of the free magnetic layer 6 is formed, but two or more insertion magnetic layers 14 may be formed. When two or more insertion magnetic layers 14 are formed, a laminated structure is made in which a soft magnetic layer, an insertion magnetic layer, a soft magnetic layer, an insertion magnetic layer, a soft magnetic layer . . . are laminated.

However, if the number of insertion magnetic layers 14 increases, the thickness of the entire free magnetic layer 6 becomes larger, and a sufficient effect of increasing the rate of change in resistance ($\Delta R/R$) may not be obtained. Therefore, when two or more insertion magnetic layers 14 are formed, two to eight insertion magnetic layers are preferably formed.

In this embodiment, in order to effectively obtain a high rate of change in resistance ($\Delta R/R$), the second pinned magnetic layer 4c preferably has a single-layered structure of Co—Fe—B or a laminated structure of Co—Fe—B and Co—Fe (Co—Fe is disposed on the insulating barrier layer 5 side). The second pinned magnetic layer 4c is preferably made of Co—Fe—B represented by a composition formula (Co☐Fe100-☐)100-☐B☐, where the atomic ratio β is in a range of 5 to 75, and the composition ratio ☐ is in a range of 10 to 30 at %. Thus, the insulating barrier layer 5 and the enhance layer 12 which are formed on the second pinned magnetic layer 4c can be appropriately formed so as to have a body-centered cubic structure (bcc structure) in which equivalent crystal planes represented by a {100} plane are preferentially aligned in a direction parallel to the layer surface (the X-Y plane). Therefore, it is possible to obtain a high rate of change in resistance ($\Delta R/R$).

In this embodiment, it is preferable that the first soft magnetic layer 13 and the second soft magnetic layer 15 are made of Ni—Fe, and the enhanced layer 12 is Co—Fe. Therefore, it is possible to obtain a high rate of change in resistance ($\Delta R/R$) and also to satisfactorily maintain the soft magnetic properties of the free magnetic layer 6.

As in a layer configuration for the experiments described below, this embodiment may be applied to a tunneling magnetic sensing element in which the pinned magnetic layer 4, the insulating barrier layer 5, and the free magnetic layer 6 are laminated in order from below. In this case, it is possible to effectively obtain a high rate of change in resistance ($\Delta R/R$), as compared with the related art.

A method of manufacturing a tunneling magnetic sensing element of this embodiment will be described. FIGS. 5 to 8 are partial sectional views of a tunneling magnetic sensing element during a manufacturing process. FIGS. 5 to 8 show the cross sections at the same position as that of the tunneling magnetic sensing element shown in FIG. 1. Although in FIGS. 6 to 8, the free magnetic layer is formed so as to have a single-layered structure, actually, the free magnetic layer is formed so as to have a laminated structure shown in FIG. 2.

Figure 5:
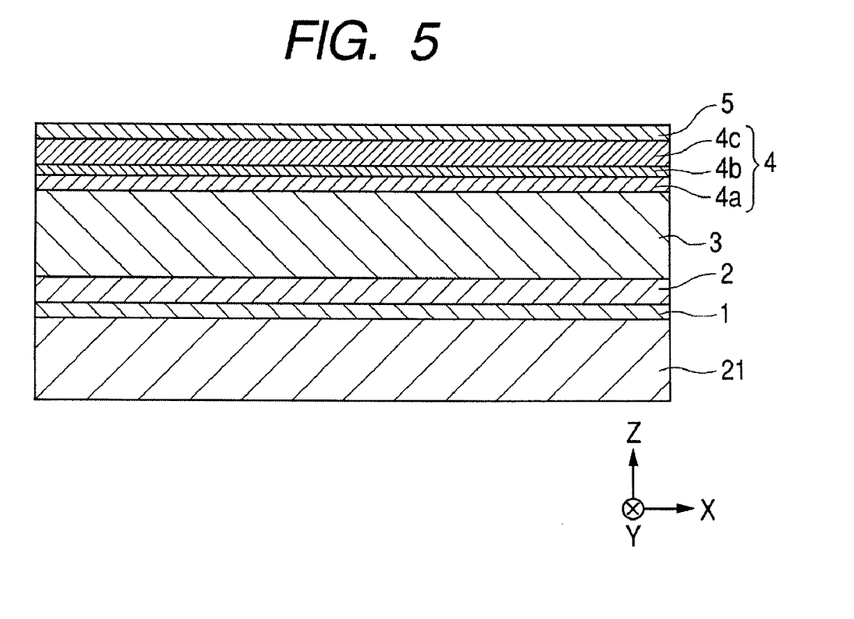
FIG. 5 is a sectional view of a tunneling magnetic sensing element during a manufacturing process taken in the same direction as in FIG. 1.

In the step shown in FIG. 5, the underlayer 1, the seed layer 2, the antiferromagnetic layer 3, the first pinned magnetic layer 4a, the nonmagnetic intermediate layer 4b, and the second pinned magnetic layer 4c, and the insulating barrier layer 5 are successively formed on the lower shield layer 21 under the same vacuum conditions.

In this embodiment, the insulating barrier layer 5 is made of Mg—O (magnesium oxide). The insulating barrier layer 5 is obtained by sputtering Mg—O on the second pinned magnetic layer 4c using an Mg—O target of a predetermined composition ratio.

Figure 6:
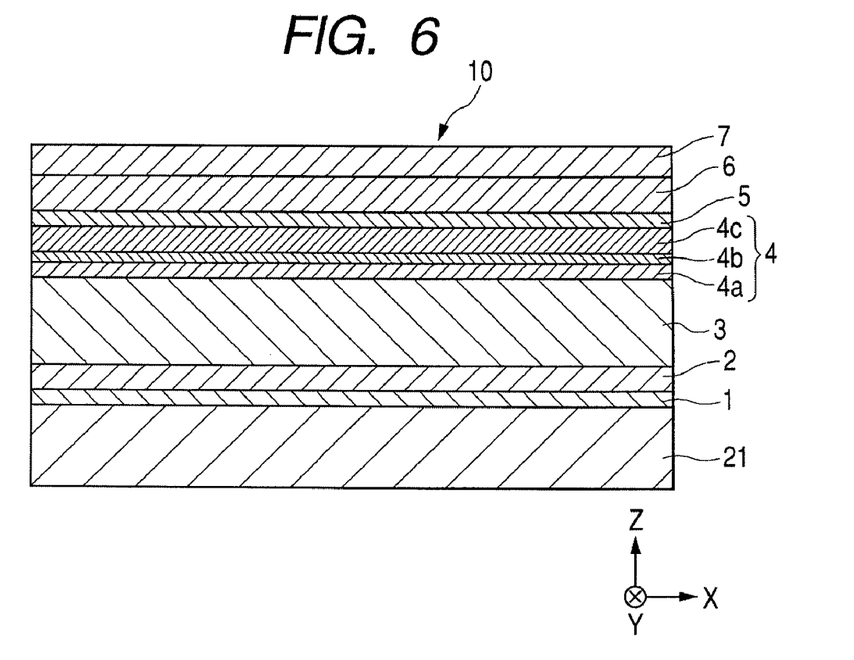
FIG. 6 is a process view (sectional view) showing a step subsequent to the step shown in FIG. 5.
Figure 7:
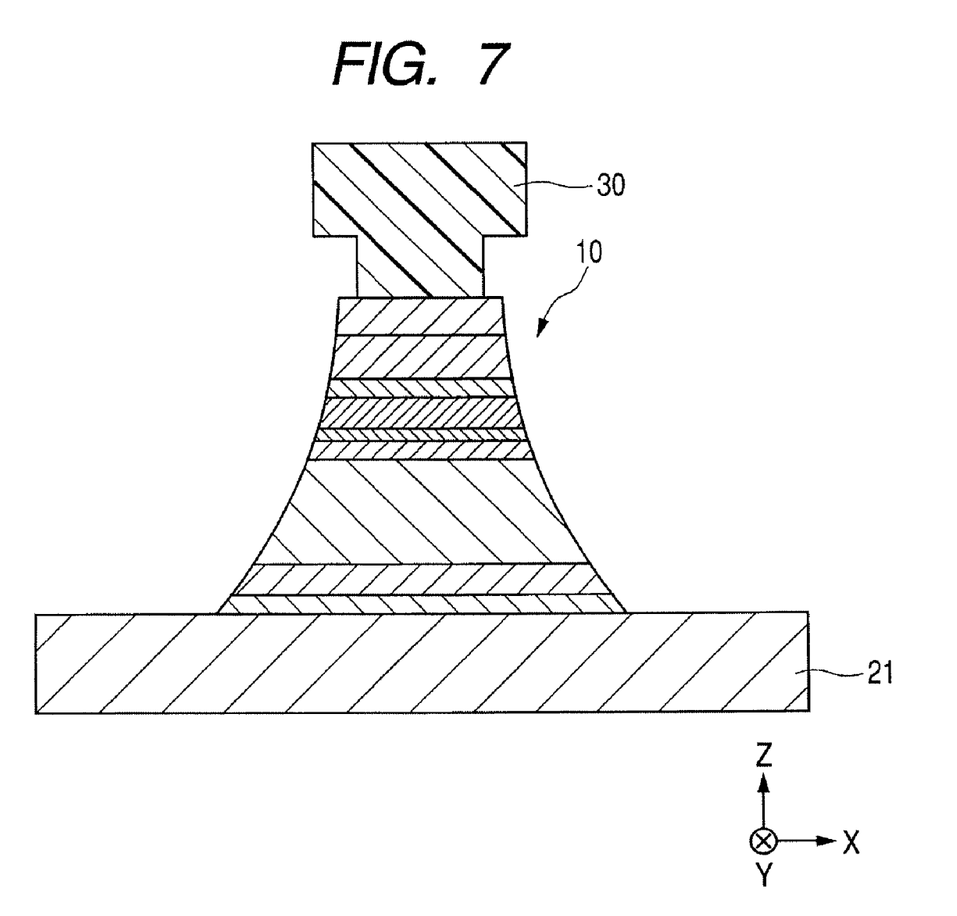
FIG. 7 is a process view (sectional view) showing a step subsequent to the step shown in FIG. 6.

Next, as shown in FIG. 6, the free magnetic layer 6 and the protective layer 7 are successively formed on the insulating barrier layer 5 under the same vacuum conditions as in FIG. 5.

In this embodiment, as shown in FIG. 2, the free magnetic layer 6 is formed by laminating the enhanced layer 12, the first soft magnetic layer 13, the insertion magnetic layer 14, and the second soft magnetic layer 15 in order from below. It is preferable that the enhance layer 12 is made of a Co—Fe alloy, the first soft magnetic layer 13 and the second soft magnetic layer 15 are made of a Ni—Fe alloy, and the insertion magnetic layer 14 is made of one selected from Co—Fe—B, Co—B, Fe—B, and Co—Fe.

Thus, the laminate 10 in which the layers from the underlayer 1 to the protective layer 7 are laminated is formed.

Next, a resist layer 30 for lift-off is formed on the laminate 10. Both ends of the laminate 10 in the track width direction (the X direction in the drawing), which are not covered with the resist layer 30 for lift-off are removed by etching or the like (see FIG. 7).

Figure 8:
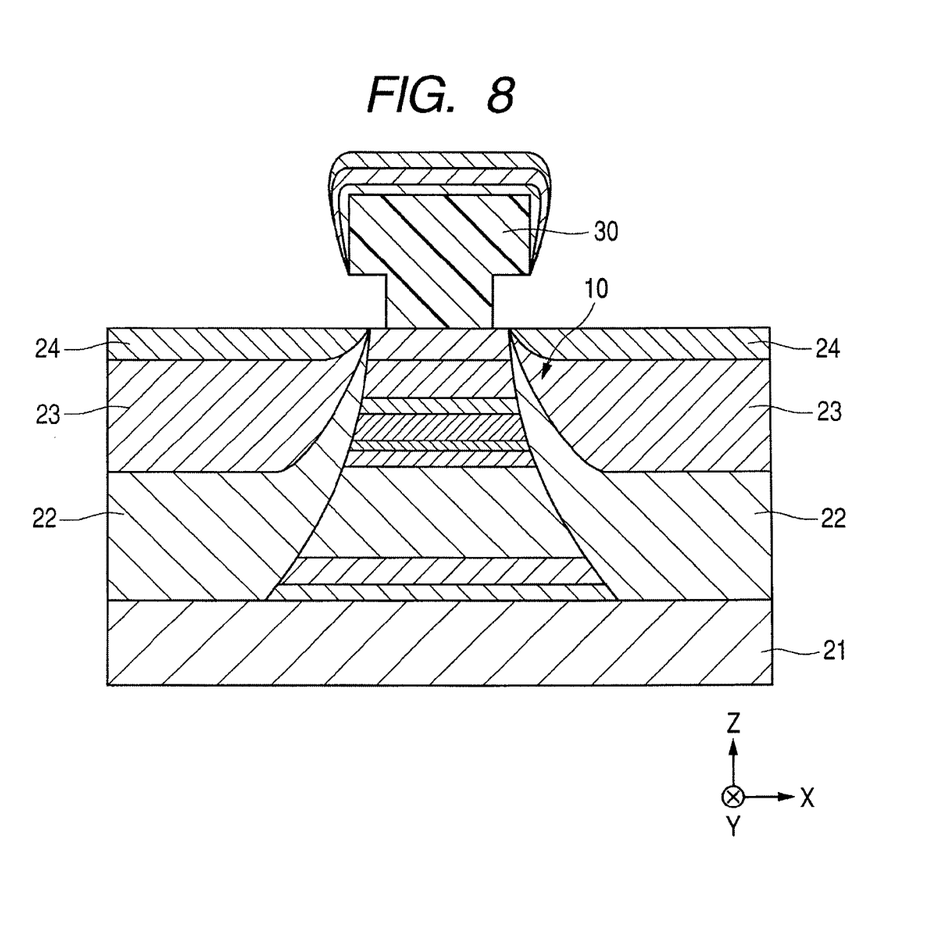
FIG. 8 is a process view (sectional view) showing a step subsequent to the step shown in FIG. 7.

Next, the insulating layer 22, the hard bias layer 23, and the protective layer 24 are laminated on the lower shield layer 21 in order from below on both sides of the laminate 10 in the track width direction (the X direction in the drawing) (see FIG. 8).

Next, the resist layer 30 for lift-off is removed, and the upper shield layer 26 is formed on the laminate 10 and the protective layer 24.

In this embodiment, the insertion magnetic layer 14 is interposed between the first soft magnetic layer 13 and the second soft magnetic layer 15, so the first soft magnetic layer 13 in contact with the enhance layer 12 can be formed so as to have a small thickness. When the first soft magnetic layer 13 is made of Ni—Fe, the first soft magnetic layer 13 is formed so as to have a face-centered cubic structure (fcc structure) in which equivalent crystal planes represented by a {111} plane are preferentially aligned in a direction parallel to the interface (the X-Y plane).

In the tunneling magnetic sensing element including the insulating barrier layer 5 made of Mg—O, the second pinned magnetic layer 4c/insulating barrier layer 5/enhance layer 12 is formed so as to have a body-centered cubic structure (bcc structure) in which equivalent crystal planes represented by a {100} plane are preferentially aligned in a direction parallel to the interface (the X-Y plane). This is important to improve the rate of change in resistance ($\Delta R/R$). Meanwhile, the first soft magnetic layer 13 in contact with the enhance layer 12 can be formed so as to have a small thickness, such that the crystal orientation of the first soft magnetic layer 13 itself can be weakened. Further, when the insertion magnetic layer 14 is in an amorphous state during a non-heat treatment, the crystal orientation between the first soft magnetic layer 13 and the second soft magnetic layer 15 can be divided. As a result, the enhance layer 12 can be effectively formed on the insulating barrier layer 5 made of Mg—O so as to have a body-centered cubic structure (bcc structure) in which equivalent crystal planes represented by a {100} plane are preferentially aligned in a direction parallel to the interface (the X-Y plane). Therefore, it is possible to simply and appropriately manufacture a tunneling magnetic sensing element having a high rate of change in resistance ($\Delta R/R$) and a small coercive force Hc, as compared with the related art.

The above-described method of manufacturing a tunneling magnetic sensing element includes a heat treatment after the laminate 10 is formed. A representative example of the heat treatment is a heat treatment for generating an exchange coupling magnetic field (Hex) between the antiferromagnetic layer 3 and the first pinned magnetic layer 4a.

The structure shown in FIG. 3 in which the free magnetic layer 6, the insulating barrier layer 5, and the pinned magnetic layer 4 are laminated in order from below, or the dual-type structure shown in FIG. 4 is manufactured by the manufacturing method described with reference to FIGS. 5 to 8.

The tunneling magnetic sensing element of this embodiment may be used not only as a magnetic head provided in a hard disk device but also as a MRAM (Magnetoresistive Random Access Memory) or a magnetic sensor.

EXAMPLE 1

As shown in FIG. 2, a tunneling magnetic sensing element was formed which includes a laminate having a free magnetic layer formed by laminating the following layers in order from below: enhanced layer 12/first soft magnetic layer 13/insertion magnetic layer 14/second soft magnetic layer 15.

A laminate was prepared by laminating the following layers in order from below: underlayer 1; Ta (30)/seed layer 2; Ru (40)/antiferromagnetic layer 3; Ir20 at % Mn80 at % (80)/pinned magnetic layer 4 [first pinned magnetic layer 4a; Fe30 at % Co70 at % (22)/nonmagnetic intermediate layer 4b; Ru (9.1)/second pinned magnetic layer 4c; [{Co50Fe50}70 at % B30 at % (18)/Co50 at % Fe50 at % (8)]]/insulating barrier layer 5; Mg50 at % O50 at % (10.2)/free magnetic layer 6 [enhanced layer 12; Fe50 at % Co50 at % (10)/first soft magnetic layer 13; Ni87 at % Fe13 at % (15)/insertion magnetic layer 14/second soft magnetic layer 15; Ni87 at % Fe13 at % (35)]/protective layer 7; [Ru (20)/Ta (180)].

The numerical value in the parenthesis of each layer in the laminate represents an average thickness, and the thickness is measured in Å.

In the experiment, the insertion magnetic layer 14 was made of one selected from Co70 at % B30 at % and Fe70 at % B30 at %. When the insertion magnetic layer 14 was made of Co70 at % B30 at %, the average thickness of the insertion magnetic layer 14 was adjusted to 2 Å, 4 Å, 6 Å, 8 Å, and 10 Å. When the insertion magnetic layer 14 was made of Fe70 at % B30 at %, the average thickness of the insertion magnetic layer 14 was set to 6 Å.

After the laminate was formed, a heat treatment was performed at 270□C for 3 hours and 40 minutes.

RELATED ART EXAMPLE 1

A sample with no insertion magnetic layer 14 formed was prepared from the laminate of Example 1, and this sample was used for Related Art Example 1.

After the laminate of Related Art Example 1 was formed, the same heat treatment as in Example 1 was performed.

In the experiment, the rate of change in resistance (□R/R) of each of Example 1 and Related Art Example 1 was measured. The experiment result is shown in FIG. 9.

Figure 9:
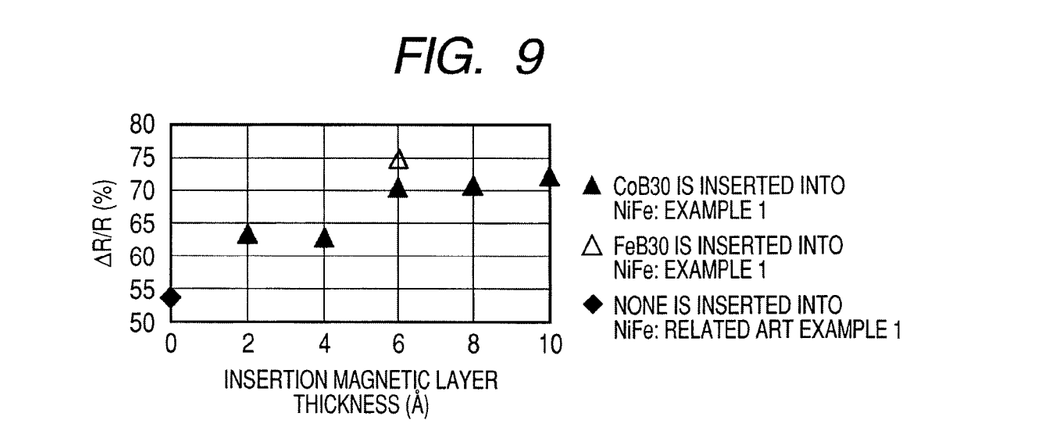
FIG. 9 is a graph showing a rate of change in resistance ($\Box$R/R) of each of Example 1 where an insertion magnetic layer made of Co—B or Fe—B is inserted into a soft magnetic layer (Ni—Fe) of a free magnetic layer (experiments are conducted on multiple samples which differ in the thickness of the insertion magnetic layer) and Related Art Example 1 where no insertion magnetic layer is inserted into the soft magnetic layer (Ni—Fe) of the free magnetic layer.

As shown in FIG. 9, it could be seen that, in Example 1 where the insertion magnetic layer 14 made of Co70 at % B30 at % or Fe70 at % B30 at % was inserted into Ni—Fe, the rate of change in resistance (□R/R) was increased, as compared with Related Art Example 1 where no insertion magnetic layer 14 was inserted into Ni—Fe.

As shown in FIG. 9, it could be seen that, if the insertion magnetic layer 14 made of Fe70 at % B30 at %, not Co70 at % B30 at %, was inserted into Ni—Fe, it was possible to effectively increase the rate of change in resistance (□R/R).

As shown in FIG. 9, it could be seen that, if the thickness of the insertion magnetic layer 14 increased, the rate of change in resistance (□R/R) gradually increased.

EXAMPLE 2

As shown in FIG. 2, a tunneling magnetic sensing element was formed which includes a laminate having a free magnetic layer formed by laminating the following layers in order from below: enhanced layer 12/first soft magnetic layer 13/insertion magnetic layer 14/second soft magnetic layer 15.

A laminate was prepared by laminating the following layers in order from below: underlayer 1; Ta (30)/seed layer 2; Ru (40)/antiferromagnetic layer 3; Ir20 at % Mn80 at % (80)/pinned magnetic layer 4 [first pinned magnetic layer 4a; Fe30 at % Co70 at % (22)/nonmagnetic intermediate layer 4b; Ru (9.1)/second pinned magnetic layer 4c; [{Co50Fe50}70 at % B 30 at % (18)/Co50 at % Fe50 at % (8)]]/insulating barrier layer 5; Mg50 at % O50 at % (11)/free magnetic layer 6 [enhanced layer 12; Fe50 at % Co50 at % (10)/first soft magnetic layer 13; Ni87 at % Fe13 at % (15)/insertion magnetic layer 14/second soft magnetic layer 15; Ni87 at % Fe13 at % (35)]/protective layer 7; [Ru (20)/Ti (180)].

The numerical value in the parenthesis of each layer in the laminate represents an average thickness, and the thickness is measured in Å.

In the experiment, the insertion magnetic layer 14 was made of {Co50Fe50}80 at % B20 at %. The average thickness of the insertion magnetic layer 14 was adjusted to 2 Å, 4 Å, 6 Å, 8 Å, and 10 Å.

After the laminate was formed, a heat treatment was performed at 270□C for 3 hours and 40 minutes.

RELATED ART EXAMPLE 2

A sample with no insertion magnetic layer 14 formed was prepared from the laminate of Example 2, and this sample was used for Related Art Example 2.

After the laminate of Related Art Example 2 was formed, the same heat treatment as in Example 2 was performed.

In the experiment, the rate of change in resistance (ΔR/R) of each of Example 2 and Related Art Example 2 was measured. The experiment result is shown in FIG. 10.

Figure 10:
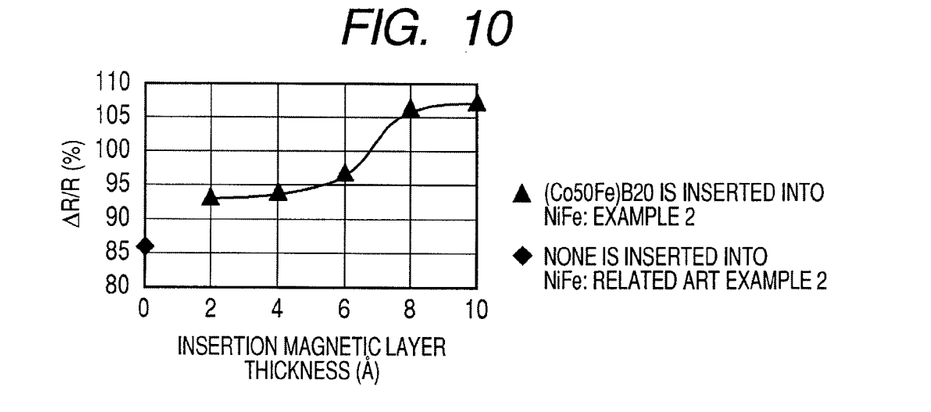
FIG. 10 is a graph showing a rate of change in resistance ($\Box$R/R) of each of Example 2 where an insertion magnetic layer made of Co—Fe—B is inserted into a soft magnetic layer (Ni—Fe) of a free magnetic layer (experiments are conducted on multiple samples which differ in the thickness of the insertion magnetic layer) and Related Art Example 2 where no insertion magnetic layer is inserted into the soft magnetic layer (Ni—Fe) of the free magnetic layer.

As shown in FIG. 10, it could be seen that, in Example 2, the rate of change in resistance (ΔR/R) was increased, as compared with Related Art Example 2. It could also be seen that, in Example 2, if the thickness of the insertion magnetic layer 14 increased, the rate of change in resistance (ΔR/R) gradually increased.

From the experiment results of FIGS. 9 and 10, the average thickness of the insertion magnetic layer 14 was preferably set to be equal to or larger than 2 Å and equal to or smaller than 10 Å. More preferably, the average thickness was set to be equal to or larger than 6 Å and equal to or smaller than 10 Å, and most preferably, the average thickness was set to be equal to or larger than 8 Å and equal to or smaller than 10 Å.

EXAMPLE 3

As shown in FIG. 2, a tunneling magnetic sensing element was formed which includes a laminate having a free magnetic layer formed by laminating the following layers in order from below: enhanced layer 12/first soft magnetic layer 13/insertion magnetic layer 14/second soft magnetic layer 15.

A laminate was prepared by laminating the following layers in order from below: underlayer 1; Ta (30)/seed layer 2; Ru (40)/antiferromagnetic layer 3; Ir20 at % Mn80 at % (80)/pinned magnetic layer 4 [first pinned magnetic layer 4a; Fe30 at % Co70 at % (22)/nonmagnetic intermediate layer 4b; Ru (9.1)/second pinned magnetic layer 4c; [{Co50Fe50}70 at % B30 at % (18)/Co50 at % Fe50 at % (8)]]/insulating barrier layer 5; Mg50 at % O50 at % (11)/free magnetic layer 6 [enhanced layer 12; Fe50 at % Co50 at % (10)/first soft magnetic layer 13; Ni87 at % Fe13 at % (15)/insertion magnetic layer 14/second soft magnetic layer 15; Ni87 at % Fe13 at % (35)]/protective layer 7; [Ru (20)/Ti (180)].

The numerical value in the parenthesis of each layer in the laminate represents an average thickness, and the thickness is measured in Å.

In the experiment, the insertion magnetic layer 14 was made of {Co50Fe50}100-Y at % BY at %. The B composition ratio Y was varied to 0 at %, 10 at %, 20 at %, and 30 at %. In this case, the average thickness of the insertion magnetic layer 14 was fixed to 10 Å.

After the laminate was formed, a heat treatment was performed at 270□C. for 3 hours and 40 minutes.

RELATED ART EXAMPLE 3

A sample with no insertion magnetic layer 14 formed was prepared from the laminate of Example 2, and this sample was used for Related Art Example 3.

After the laminate of Related Art Example 3 was formed, the same heat treatment of Example 3 was performed.

In the experiment, the rate of change in resistance (□R/R) of each of Example 3 and Related Art Example 3 was measured. The experiment result is shown in FIG. 11.

Figure 11:
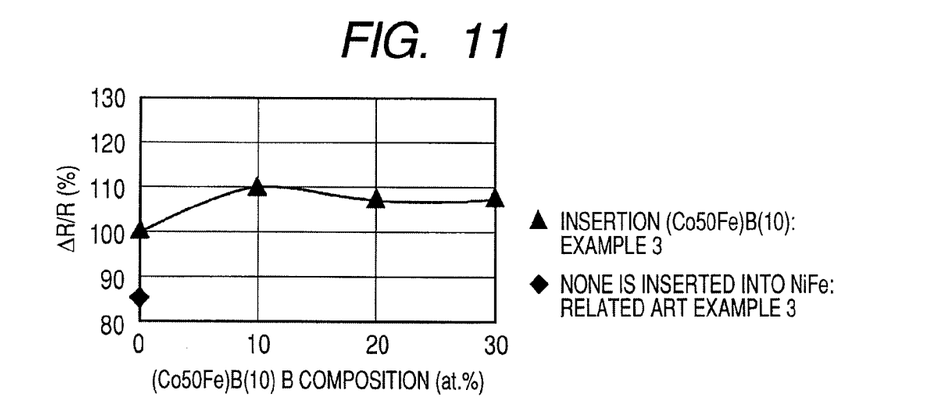
FIG. 11 is a graph showing a rate of change in resistance ($\Box$R/R) of each of Example 3 where an insertion magnetic layer made of Co—Fe—B is inserted into a soft magnetic layer (Ni—Fe) of a free magnetic layer (experiments are conducted on multiple samples which differ in the B composition ratio) and Related Art Example 3 where no insertion magnetic layer is inserted into the soft magnetic layer (Ni—Fe) of the free magnetic layer.

As shown in FIG. 11, it could be seen that, in Example 3, the rate of change in resistance (ΔR/R) increased, as compared with Related Art Example 3. It could also be seen that, in Example 3, if B was contained and the B composition ratio Y was large, it was possible to increase the rate of change in resistance (□R/R), as compared with a case where the insertion magnetic layer 14 was made of Co—Fe while the B composition ratio Y is 0 at %.

From the experiment result shown in FIG. 11, the insertion magnetic layer 14 was preferably made of Co—Fe—B. In this case, the B composition ratio Y was preferably set to be equal to or larger than 10 at % and equal to or smaller than 30 at %.

Next, the coercive force Hc of the free magnetic layer in the tunneling magnetic sensing element used for each of Example 2 and Related Art Example 2 was measured. In Example 2, the thickness of the insertion magnetic layer was varied to 2 Å, 4 Å, 6 Å, 8 Å, and 10 Å, so the coercive force Hc of the free magnetic layer of each sample was measured.

The free magnetic layer of Example 2 was formed so as to have the following laminated structured and used for Comparative Example 1.

The free magnetic layer of Comparative Example 1 was formed by laminating the following layers in order from below: enhanced layer 12; Fe50 at % Co50 at % (10)/{Co50Fe50}80 at % B20 at %/Ni87 at % Fe13 at % (50). The thickness of {Co50Fe50}80 at % Fe20 at % of Comparative Example 1 was adjusted to 2 Å, 4 Å, 6 Å, 8 Å, and 10 Å, and the same heat treatment as in Example 2 was performed. Then, the coercive force Hc of the free magnetic layer of Comparative Example 1 was examined.

The total thickness of the Ni—Fe layer (soft magnetic layer) constituting the free magnetic layer of each of Example 2, Related Art Example 2, and Comparative Example 1 is the same as 50 Å.

Figure 12:
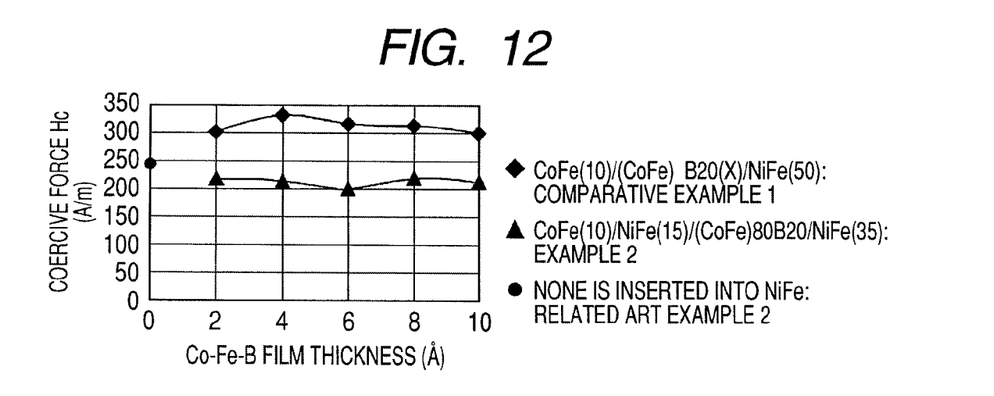
FIG. 12 is a graph showing a coercive force Hc of a free magnetic layer in each of the samples of Example 2 and Related Art Example 2 of FIG. 10, and Comparative Example 1 where a free magnetic layer is laminated in order of Fe—Co/Co—Fe—B/Ni—Fe from an insulating barrier layer side (similarly to Example 2, experiments are conducted on multiple samples which differ in the thickness of Co—Fe—B).

FIG. 12 shows the coercive force Hc of the free magnetic layer of each of Example 2, Related Art Example 2, and Comparative Example 1.

As shown in FIG. 12, in Example 2, the coercive force Hc of the free magnetic layer could be reduced, as compared with Related Art Example 2 and Comparative Example 1.

It could be seen that, in Comparative Example 1, the coercive force Hc increased, as compared with Related Art Example 1. The configuration of Comparative Example 1 has been described in the paragraph [0015] of Japanese Unexamined Patent Application Publication No. 2007-59879. It could be seen that, with the configuration of Comparative Example 1, the stability of the reproduction characteristics was deteriorated, and it is not suitable for the free magnetic layer of the tunneling magnetic sensing element.

For this reason, it could be seen that, in order to increase the rate of change in resistance (□R/R) and also to reduce the coercive force Hc of the free magnetic layer, the free magnetic layer needed to be formed so as to have a laminated structure in which the following layers were laminated from the insulating barrier layer side: enhanced layer (Co—Fe)/soft magnetic layer (Ni—Fe)/insertion magnetic layer (preferably made of Co—Fe—B)/soft magnetic layer (Ni—Fe).

It should be understood by those skilled in the art that various modifications, combinations, sub-combinations and alterations may occur depending on design requirements and other factors insofar as they are within the scope of the appended claims or the equivalents thereof.

The invention claimed is:
1. A tunneling magnetic sensing element comprising:
a laminate in which a pinned magnetic layer having a magnetization direction pinned, an insulating barrier layer, and a free magnetic layer having a magnetization direction variable with an external magnetic field, or the free magnetic layer, the insulating barrier layer, and the pinned magnetic layer are laminated in order from below, the pinned magnetic layer including a second pinned magnetic layer adjacent to the insulating barrier layer, wherein the insulating barrier layer is made of Mg—O, the free magnetic layer has a soft magnetic layer and an enhanced layer disposed between the soft magnetic layer and the insulating barrier layer to have a spin polarization ratio higher than the soft magnetic layer, and an insertion magnetic layer made of one selected from Co—Fe—B, Co—B, Fe—B, and Co—Fe is inserted into the soft magnetic layer in a direction parallel to the interface of each layer constituting the laminate, and the soft magnetic layer is divided into multiple layers in a thickness direction through the insertion magnetic layer, the multiple layers including a first soft magnetic layer between the insertion magnetic layer and the enhanced layer, wherein the second pinned magnetic layer, the insulating barrier layer Mg—O and the enhance layer have a body-centered cubic structure (bcc structure) in which equivalent crystal planes represented by a {100} plane are preferentially aligned in a direction parallel to the interface, wherein the soft magnetic layer has a face-centered cubic structure (fcc structure) in which equivalent crystal planes represented by a {111} plane are preferentially aligned in a direction parallel to the interface, and wherein the thickness of the first soft magnetic layer equal to or larger than 5 Å and equal to or less than 30 Å.

2. The tunneling magnetic sensing element according to claim 1, wherein the insertion magnetic layer is made of a magnetic material represented by a composition formula $\{Co_x Fe_{100-X}\}_{100-Y} B_Y$ (where the atomic ratio X is equal to or larger than 0 and equal to or smaller than 100, and the composition ratio Y is equal to or larger than 0 at % and equal to or smaller than 30 at %).

3. The tunneling magnetic sensing element according to claim 2, wherein the insertion magnetic layer is made of Fe—B or Co—Fe—B.

4. The tunneling magnetic sensing element according to claim 3, wherein the atomic ratio X is equal to or larger than 0 and equal to or smaller than 50, and the composition ratio Y is equal to or larger than 10 at % and equal to or smaller than 30 at %.

5. The tunneling magnetic sensing element according to claim 1, wherein the average thickness of the insertion magnetic layer is equal to or larger than 2 Å and equal to or smaller than 10 Å.

6. The tunneling magnetic sensing element according to claim 1, wherein the soft magnetic layer is made of Ni—Fe, and the enhanced layer is made of Co—Fe.

7. The tunneling magnetic sensing element according to claim 1, wherein the pinned magnetic layer, the insulating barrier layer, and the free magnetic layer are laminated in order from below.

* * * * *